United States Patent
Zhang et al.

(10) Patent No.: US 7,548,117 B2
(45) Date of Patent: Jun. 16, 2009

(54) DIFFERENTIAL AMPLIFIER HAVING AN IMPROVED SLEW RATE

(75) Inventors: Gangqiang Zhang, San Jose, CA (US); Fansheng Meng, Shenzhen (CN)

(73) Assignee: Shenzhen STS Microelectronics Co. Ltd. (CN)

( * ) Notice: Subject to any disclaimer, the term of this patent is extended or adjusted under 35 U.S.C. 154(b) by 122 days.

(21) Appl. No.: 11/654,976

(22) Filed: Jan. 18, 2007

(65) Prior Publication Data

US 2007/0170993 A1    Jul. 26, 2007

(30) Foreign Application Priority Data

Jan. 20, 2006    (CN) .................. 2006 1 0005984

(51) Int. Cl.
     *H03F 1/14*      (2006.01)
(52) U.S. Cl. ...................................... 330/292; 330/255
(58) Field of Classification Search ......... 330/292–294, 330/255
See application file for complete search history.

(56) References Cited

U.S. PATENT DOCUMENTS

| 4,446,443 A | 5/1984 | Johnson et al. | |
|---|---|---|---|
| 4,668,919 A * | 5/1987 | de Weck | 330/253 |
| 5,128,631 A | 7/1992 | Feliz et al. | |
| 5,223,753 A * | 6/1993 | Lee et al. | 327/65 |
| 5,343,164 A | 8/1994 | Holmdahl | |
| 5,399,992 A * | 3/1995 | Itakura et al. | 330/257 |
| 6,392,485 B1 | 5/2002 | Doi et al. | |
| 2006/0091955 A1* | 5/2006 | Choi | 330/260 |
| 2006/0170458 A1 | 8/2006 | Lee et al. | |

* cited by examiner

*Primary Examiner*—Robert Pascal
*Assistant Examiner*—Khiem D Nguyen
(74) *Attorney, Agent, or Firm*—Lisa K. Jorgenson; Andre M. Szuwalski

(57) ABSTRACT

A differential amplifier receives a differential input signal and generates an output signal at an output node. An auxiliary circuit coupled to the differential amplifier operates to improve slew rate response. In quiescent and small signal situations with respect to the differential input signal, the auxiliary circuit does not alter or change operation of the differential amplifier. However, in situations where a large signal change is experienced with respect to the differential input signal, the auxiliary circuit functions to speed up the sourcing and sinking current to/from the output node. A stability compensation capacitor coupled to the output node is accordingly more quickly charged or discharged and an improvement in slew rate performance of the differential amplifier is experienced.

15 Claims, 2 Drawing Sheets

US 7,548,117 B2

DIFFERENTIAL AMPLIFIER HAVING AN IMPROVED SLEW RATE

PRIORITY CLAIM

This application for patent claims the benefit of Chinese Application for Patent No. 200610005984.8 filed Jan. 20, 2006, the disclosure of which is hereby incorporated by reference.

BACKGROUND OF THE INVENTION

1. Technical Field of the Invention

The present invention relates to differential amplifiers and, in particular, to a differential amplifier including circuitry which improves slew rate.

2. Description of Related Art

Reference is made to FIG. 1 wherein there is shown a circuit diagram of a conventional and traditional, prior art, differential amplifier 10. The differential signal input Vi (having components Vi+ and Vi−) is received at the gate terminals of the differential input transistors (p-channel) M1 and M2. The source terminals of M1 and M2 are coupled together and to a first terminal of a current source 12 which supplies a current 2I. A second terminal of the current source 12 is coupled to a reference voltage Vdd.

The drain terminal of M1 is coupled to the drain and gate terminals of (n-channel) transistor M4. A source terminal of transistor M4 is coupled to a reference voltage ground. The gate terminal of transistor M4 is further coupled to the gate of (n-channel) transistor M3. A source terminal of transistor M3 is also coupled to the reference voltage ground. The drain terminal of transistor M3 is coupled to the drain terminal and gate terminal of (p-channel) transistor M7. A source terminal of transistor M7 is coupled to the reference voltage Vdd.

The drain terminal of M2 is coupled to the drain and gate terminals of (n-channel) transistor M5. A source terminal of transistor M5 is coupled to the reference voltage ground. The gate terminal of transistor M5 is further coupled to the gate of (n-channel) transistor M6. A source terminal of transistor M6 is also coupled to the reference voltage ground. The drain terminal of transistor M6 is coupled to the drain terminal of (p-channel) transistor M8. A source terminal of transistor M8 is coupled to the reference voltage Vdd.

The gate terminals of transistors M7 and M8 are coupled together. Thus, current in transistor M1 is mirrored to transistor M8 using transistors M3, M4 and M7. The current of transistor M2 is mirrored to transistor M6 using transistor M5.

An output of the differential amplifier 10 is taken at the common drain terminal coupling between transistors M6 and M8. This point is labeled as node "OUT." The output current Io1 from node OUT is the difference between the currents of transistors M8 and M6 (or in other words, the difference between the current of transistors M1 and M2 which receive the differential signal input Vi+ and Vi−).

A capacitor C is coupled between the output node OUT and the reference voltage ground. The capacitor C is known in the art as the stability compensation capacitor for closed loop operation.

When the differential input signal Vi is a positive large signal (the conclusion for a negative large signal being similar), transistor M1 is on and transistor M2 is off. In this condition, the currents in transistors M1 and M8 are equal to each other and to the 2I current supplied by current source 12. The current in transistors M2 and M6 are also equal to each other, but are zero. The output current Io1 is equal, as discussed above, to the difference between the currents of transistors M8 and M6, which in this case is the current 2I supplied by current source 12. By known equation, one can calculate the slew rate of the output voltage Vo at node OUT as:

$$SR = Io1/C$$

which is:

$$SR = 2I/C.$$

Reference is now made to FIG. 2 which is a graph of voltage versus time with respect to the output voltage Vo of the traditional differential amplifier 10 of FIG. 1 when the input differential signal Vi a 2V peak-to-peak square wave (see, FIG. 3). The graph of FIG. 2 shows results when the differential amplifier 10 of FIG. 1 is configured as a unity gain buffer. The illustration is further made using a transient simulation analysis.

What can be seen in FIG. 2 is that the slew rate of the traditional differential amplifier 10 of FIG. 1, with respect to the input signal of FIG. 3, dictates a transition time period on the order of about 5 microseconds. In many known applications of differential amplifiers, this slew rate response is quite unacceptable (i.e., it is too slow). It can be improved by increasing the current source 12, but the power dissipation is also increased and the frequency response of the amplifier is changed and this may lead to instability.

A need accordingly exists in the art for a differential amplifier circuit which presents a faster and thus more acceptable slew rate than that provided by a traditional differential amplifier like that shown in FIG. 1.

SUMMARY OF THE INVENTION

In accordance with an embodiment of the invention, a circuit is provided for connection to a compensation capacitor associated with a differential amplifier. That circuit comprises a current source circuit coupled to sense differential amplifier operation and source current to the compensation capacitor is response to detecting that the differential amplifier is operating responsive to a first high input voltage differential. The circuit further comprises a current sink circuit coupled to sense differential amplifier operation and sink current from the compensation capacitor is response to detecting that the differential amplifier is operating responsive to a second high input voltage differential.

In accordance with another embodiment, a differential amplifier comprises a differential amplifier stage having a differential voltage input and a current output node, a compensation capacitor coupled to the current output node, and a slew rate enhancement stage coupled to the differential amplifier stage and the compensation capacitor, the slew rate enhancement stage operable to selectively source/sink current to/from the current output node in addition to any current sourced/sunk to/from the current output node by the differential amplifier stage itself.

In accordance with yet another embodiment, a differential amplifier comprises a differential amplifier stage having differential voltage inputs, a current source transistor coupled to a current output node and a current sink transistor coupled to the current output node, and a compensation capacitor coupled to the current output node. A current source sensor circuit is coupled to the current source transistor and operable to detect when current is being sourced to the current output node by the differential amplifier stage itself, while a current sink sensor circuit is coupled to the current sink transistor and operable to detect when current is being sunk from the current output node by the differential amplifier stage itself. An additional current source transistor is also coupled to the current output node and is operable responsive the current source sensor circuit to source additional current to the current output node, while an additional current sink transistor is also coupled to the current output node and is operable responsive the current sink sensor circuit to sink additional current to the current output node.

In another embodiment, a differential amplifier comprises a differential amplifier stage having a differential voltage input and a current output node, a compensation capacitor coupled to the current output node, and a capacitor charge/discharge stage coupled to the differential amplifier stage and the compensation capacitor. The capacitor charge/discharge stage is operable to detect when the differential amplifier stage is operating responsive to a high differential voltage input and respond thereto by assisting the differential amplifier stage in more quickly charging/discharge the compensation capacitor than the differential amplifier stage is capable of doing by itself.

BRIEF DESCRIPTION OF THE DRAWINGS

A more complete understanding of the invention may be obtained by reference to the accompanying drawings wherein.

DETAILED DESCRIPTION OF THE DRAWINGS

Figure 1:
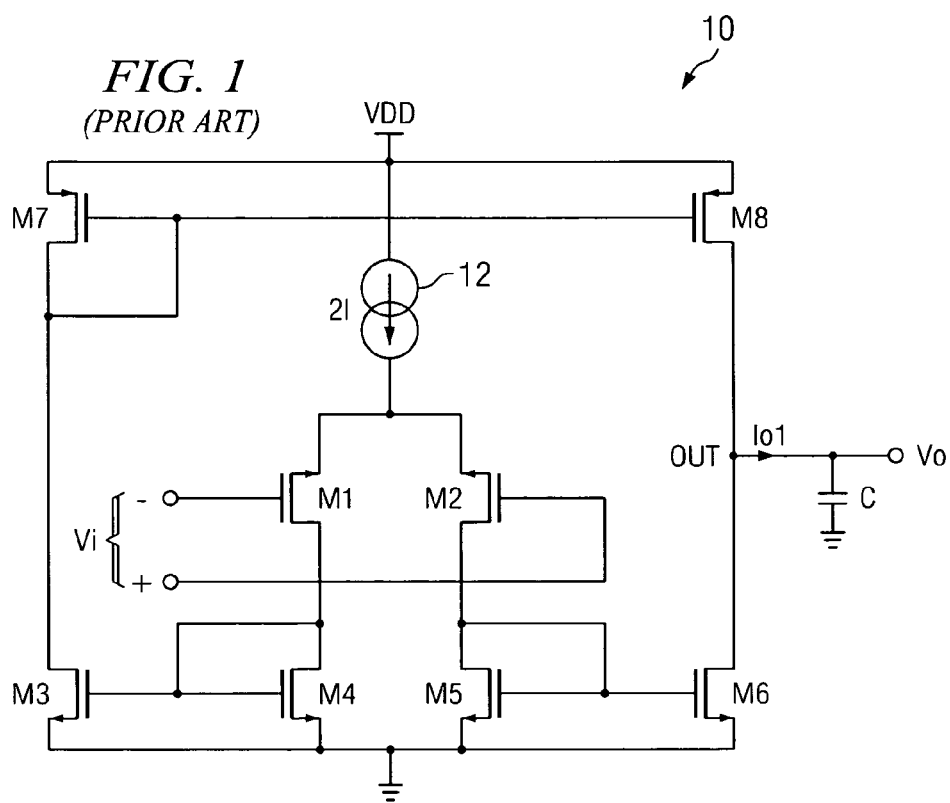
FIG. 1 is a circuit diagram of a conventional and traditional, prior art, differential amplifier.
Figure 4:
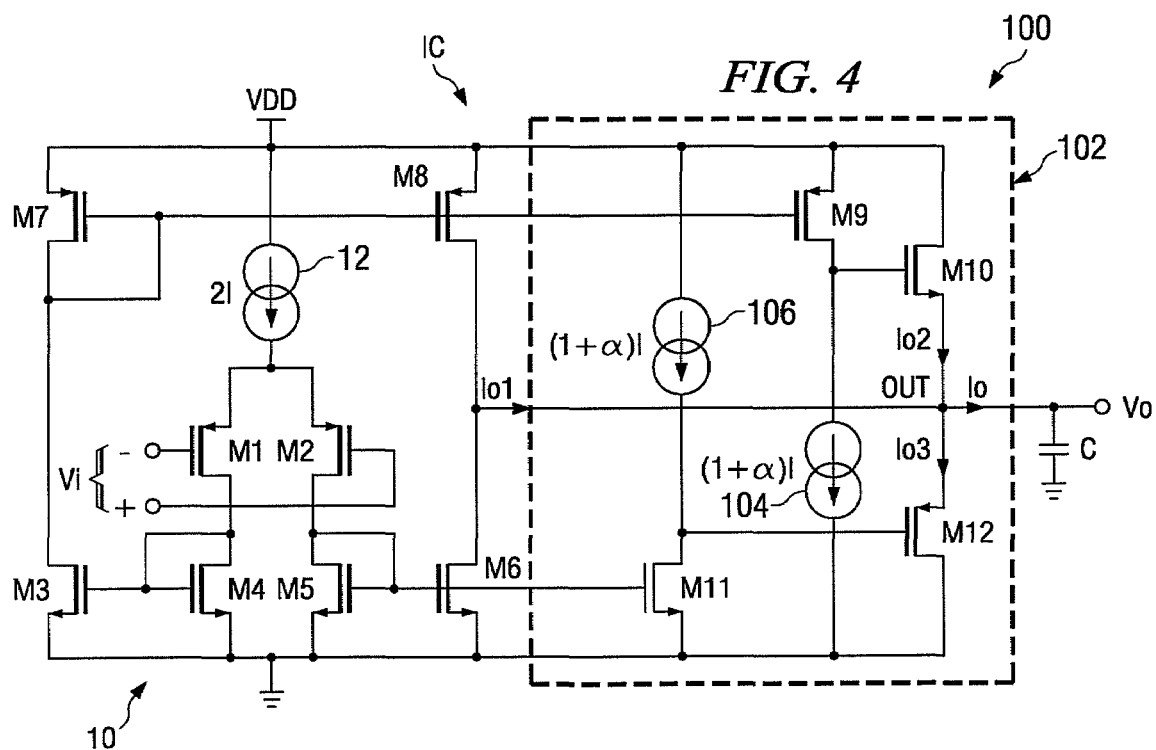
FIG. 4 is a circuit diagram of a differential amplifier in accordance with an embodiment of the present invention.

Reference is now made to FIG. 4 wherein there is shown a circuit diagram of a differential amplifier 100 in accordance with an embodiment of the present invention. In the FIG. 4 illustration, like or identical components to the conventional and traditional, prior art, differential amplifier 10 of FIG. 1 are provided with the same reference labels. Further discussion of such components is omitted, except as necessary to understand the embodiment of FIG. 4, and the reader is directed to review the previous discussion of FIG. 1 which is incorporated herein by reference.

The differential amplifier 100 of FIG. 4 has a similar constitution to the amplifier 10 of FIG. 1 with respect to the following components: the current source 2I, transistors M1-M8 and the capacitor C. The amplifier 100 accordingly has a differential amplifier stage 10. An auxiliary circuit 102 is added to the amplifier stage 10 to form the differential amplifier 100 of the present invention. The auxiliary circuit 102 includes a transistor (p-channel) M9 whose gate terminal is coupled to the gate terminals of transistors M7 and M8. A source terminal of transistor M9 is coupled to the reference voltage Vdd. A drain terminal of transistor M9 is coupled to a first terminal of a current source 104 which supplies a current $(1+\alpha)I$. A second terminal of the current source 104 is coupled to the reference voltage ground.

The auxiliary circuit 102 further includes a transistor (n-channel) M10 whose drain terminal is coupled to the reference voltage Vdd. A gate terminal of transistor M10 is coupled to the drain terminal of transistor M9. A source terminal of transistor M10 is coupled to the output node OUT.

The auxiliary circuit 102 also includes a transistor (n-channel) M11 whose gate terminal is coupled to the gate terminals of transistors M5 and M6. A source terminal of transistor M11 is coupled to the reference voltage ground. A drain terminal of transistor M11 is coupled to a first terminal of a current source 106 which supplies a current $(1+\alpha)I$. A second terminal of the current source 106 is coupled to the reference voltage Vdd.

The auxiliary circuit 102 still further includes a transistor (p-channel) M12 whose drain terminal is coupled to the reference voltage ground. A gate terminal of transistor M12 is coupled to the drain terminal of transistor M11. A source terminal of transistor M12 is coupled to the output node OUT.

Transistors M9 and M11 copy the current of transistors M8 and M6, respectively. The quiescent current of transistors M9/M11 is I, and in this situation the drain voltage of transistors M9/M11 is 0V/Vdd which causes transistors M10 and M12 to both be turned off. In small signal operation (i.e., when there is only a small difference between the differential signal inputs Vi+ and Vi−), the current of transistors M9/M11 is less than $(1+\alpha)I$, and in this case transistors M10 and M12 are also turned off because the drain voltage of transistor M9 is very low and the drain voltage of transistor M11 is very high. Thus, in the quiescent and small signal states, the transistors M10 and M12 have no impact on the operation of the differential amplifier 100, and thus the operation is in essence substantially identical to that experienced with the traditional differential amplifier 10 of FIG. 1.

If, on the other hand, the input voltage Vi is large enough (i.e., when there is a large difference between the differential signal inputs Vi+ and Vi−), the copied currents in transistors M9/M11 become substantially unbalanced and the drain voltage of transistor M9/M11 becomes large/small enough to turn the corresponding transistor M10/M12 on. When this occurs, the source currents Io2 and Io3 of transistors M10 and M12, respectively, which flow through node OUT help speed up the charging and discharging, respectively, of the capacitor C depending on which direction the input differential signal Vi is swinging. In effect, the transistor M9 and current source 104 function as a sensor to detect operation of the differential amplifier 10 in a mode where there exists a first high input voltage differential (i.e., when there is a large difference in a first direction between the differential signal inputs Vi+ and Vi−). Similarly, the transistor M11 and current source 106 function as a sensor to detect operation of the differential amplifier 10 in a mode where there exists a second high input voltage differential (i.e., when there is a large difference in a second, opposite, direction between the differential signal inputs Vi+ and Vi−). In effect, the circuits M9/104 and M11/106 function as current comparison circuits wherein the copied currents from M8 and M6, respectively, in transistors M9 and M11 are each compared against the current $(1+\alpha)I$ provided by their respective current sources 104 and 106. When unbalanced, the signals at the gate terminals of transistors M10 or M12 cause one or the other transistor to turn on and thus source current to, or sink current from, the output node OUT and the capacitor C.

For example, with respect to charging the capacitor C in a large differential input voltage swing scenario, transistor M10 is turned on and the output current Io from node OUT in FIG. 4 will be:

$$Io=Io1+Io2$$

where Io1=2I (as discussed above with respect to FIG. 1). So, the slew rate of the output voltage Vo can be calculated as:

$$SR=Io/C=(Io1+Io2)/C$$

such that:

$$SR>2I/C.$$

This slew rate is, thus, better than the slew rate for the conventional and traditional, prior art, differential amplifier 10 of FIG. 1 as discussed above.

Conversely, with respect to discharging the capacitor C in an opposite large differential input voltage swing scenario, transistor M12 is turned on and the output current Io from node OUT in FIG. 4 will be:

$$Io=(Io1-Io3)$$

where Io1=−2I. So, the slew rate of the output voltage Vo can be calculated as:

$$SR=Io/C=(Io1-Io3)/C$$

such that:

$$SR<-2I/C.$$

In either case, the slew rate is better than the best possible slew rate for the conventional and traditional, prior art, differential amplifier 10 of FIG. 1 as discussed above.

By selecting an appropriate value of $\alpha$ such that ($0<\alpha<1$), and by selecting an appropriate width-length (W/L) ratio for transistors M10 and M12, very good large signal transient characteristics can be obtained. For example, simulation testing has shown that a value of $\alpha=0.07$ and a width-length ratio W/L=1 for transistor M10 and 3 for transistor M12 provide good results. Other combinations of values may provide same or better results in a given situation.

Figure 3:
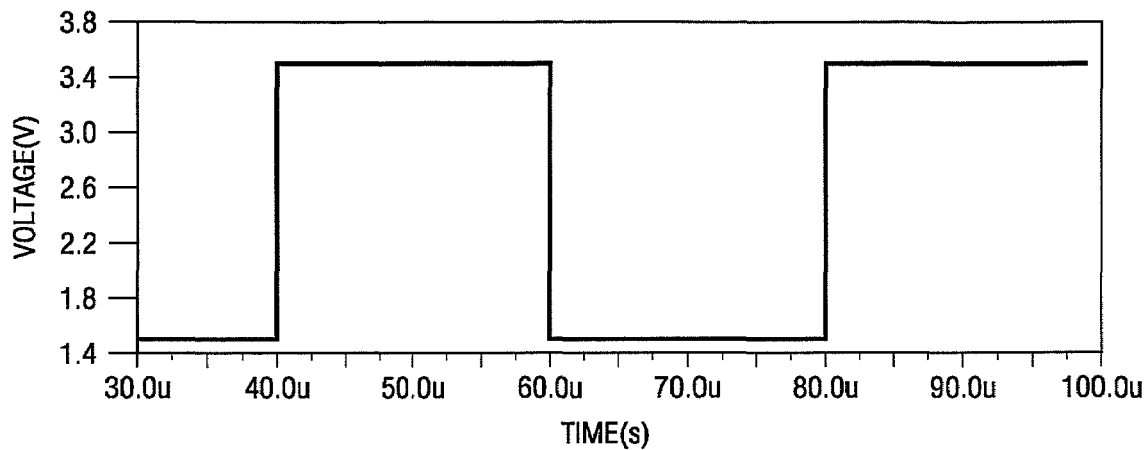
FIG. 3 a graph of voltage versus time with respect to an input voltage square wave.
Figure 5:
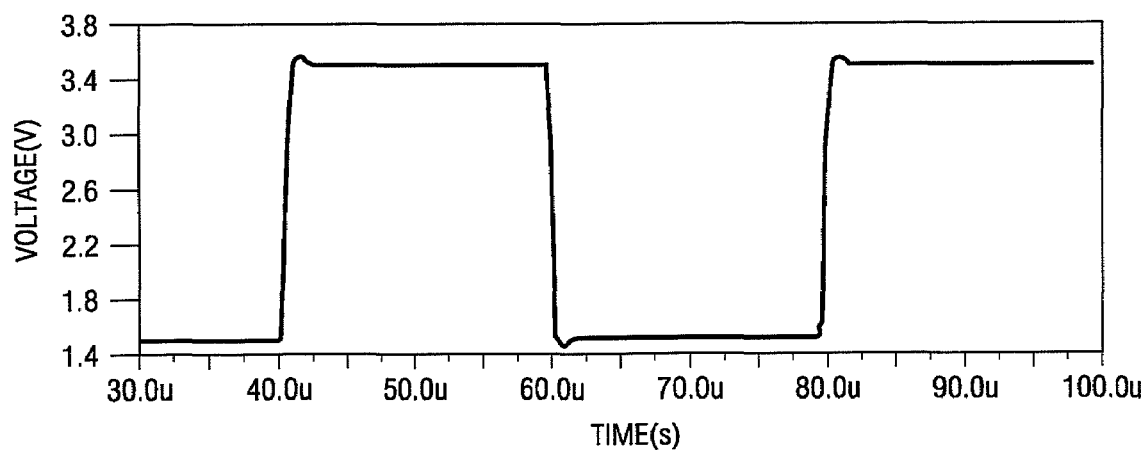
FIG. 5 is a graph of voltage versus time with respect to the output voltage of the differential amplifier of FIG. 4.

Reference is now made to FIG. 5 which is a graph of voltage versus time with respect to the output voltage Vo of the differential amplifier 100 of FIG. 4 when the input differential signal Vi a 2V peak-to-peak square wave (see, FIG. 3). The graph of FIG. 5 shows results when the differential amplifier 100 of FIG. 4 is configured as a unity gain buffer. The illustration is further made using a transient simulation analysis.

Figure 2:
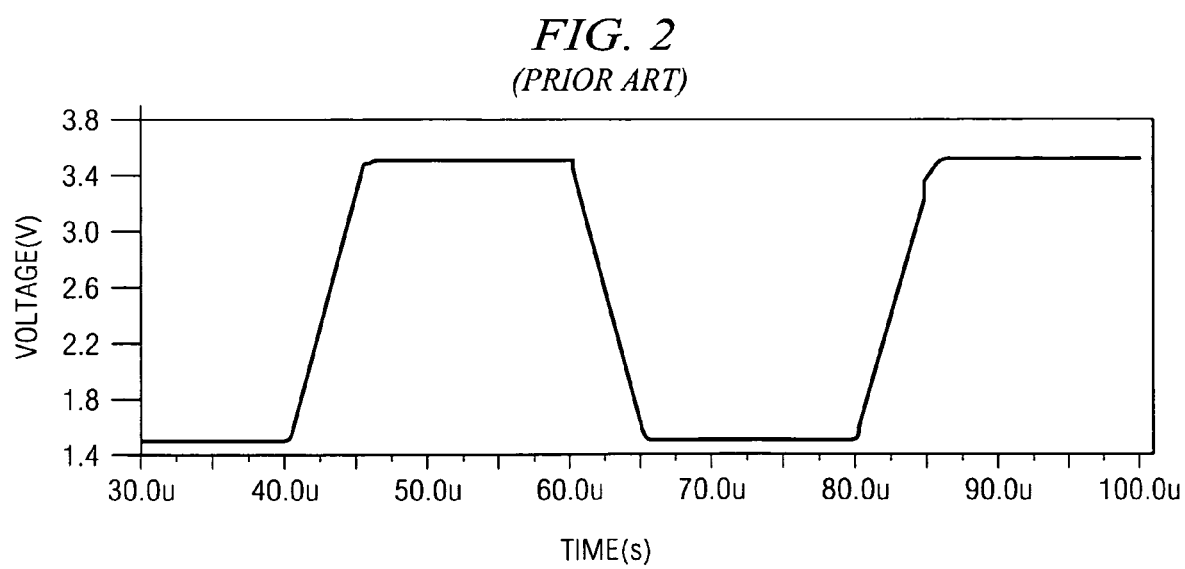
FIG. 2 is a graph of voltage versus time with respect to the output voltage of the differential amplifier of FIG. 1.

What can be seen in FIG. 5, especially when taken in comparison to FIG. 2, is that the slew rate of the differential amplifier 100 of FIG. 4, with respect to the input signal of FIG. 3, is much improved and provides a transition time period that is much less than the about 5 microseconds delay experienced with respect to the conventional and traditional, prior art, differential amplifier 10 of FIG. 1.

The differential amplifier of FIG. 4 can be used in any number of possible circuit applications as recognized by those skilled in the art. It has been noted that the amplifier 100 is especially useful in linear voltage regulator applications.

While the circuit of FIG. 4 shows the use of FET-type transistors, it will be understood that the differential amplifier design is equally applicable to the use of other transistor types such as, for example, bipolar transistors. Still further, while transistors of a certain conductivity type are shown and described, it will be recognized that the circuit could be alternately configured with opposite conductivity type transistors as desired for a given application.

In the description of the amplifier 100, the term "coupled" was used to describe the interconnection of certain circuit components. The term "coupled" as used herein is not to be construed as requiring a direct connection between parts. The addition of other components, for example connected between those illustrated in FIG. 4, provided those components do not substantively change the operational characteristics of the amplifier with respect to improving slew rate response, is considerate to be within the scope of the present invention.

The differential amplifier 100 may be constructed of discrete components for a given circuit application. In a preferred embodiment, however, the amplifier 100 is fabricated as an integrated circuit (IC) on a semiconductor substrate, and may include one or more other circuits.

In the context of this description, it will be recognized that the gate terminal of a transistor comprises its control terminal, and that the source-drain circuit of the transistor comprises its controllable conduction path or circuit. Similar terms may also be applied in the context of a bipolar transistor when referring to its base terminal and emitter-collector circuit.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
    a differential amplifier circuit including a first transistor for sourcing current to an output node and a second transistor for sinking current from the output node;
    a compensation capacitor with a first terminal connected to the output node;
    a current source circuit coupled to sense differential amplifier circuit operation and source additional current to the output node and first terminal of the compensation capacitor in response to detecting that the differential amplifier is operating responsive to a first high input voltage differential; and
    a current sink circuit coupled to sense differential amplifier operation and sink additional current from the output node and first terminal of the compensation capacitor in response to detecting that the differential amplifier is operating responsive to a second high input voltage differential;
    wherein the current source circuit comprises:
        a third current source transistor having a conduction path coupled to source the additional current to the output node and first terminal of the compensation capacitor and a control terminal; and
        a sensing circuit having an input measuring a current sourced by the first transistor of the differential amplifier circuit to the output node and an output coupled to the control terminal of the third current source transistor.

2. The circuit of claim 1 wherein the output of the sensing circuit causes the current source transistor to turn on in response to the sensing of current being sourced by the first transistor of the differential amplifier circuit.

3. The circuit of claim 1 wherein the current sink circuit comprises:
    a fourth current sink transistor having a conduction path coupled to sink the additional current from the output node and first terminal of the compensation capacitor and a control terminal; and
    a sensing circuit having an input measuring a current sunk by the second transistor of the differential amplifier circuit from the output node and an output coupled to the control terminal of the fourth current sink transistor.

4. The circuit of claim 3 wherein the output of the sensing circuit causes the fourth current sink transistor to turn on in response to the sensing of current being sunk by the second transistor of the differential amplifier circuit.

5. The circuit of claim 1 wherein the circuit is fabricated as an integrated circuit.

6. A differential amplifier comprising:
    a differential amplifier stage having a differential voltage input and a current output node with respect to which the differential amplifier stage sources/sinks current;
    a compensation capacitor coupled to the current output node; and
    a slew rate enhancement stage coupled to the differential amplifier stage and the compensation capacitor, the slew rate enhancement stage operating to selectively source/ sink current to/from the current output node in addition to the current being sourced/sunk to/from the current output node by the differential amplifier stage itself;

wherein the slew rate enhancement stage comprises:

a controllable current circuit operable to selectively source/sink the additional current to/from the current output node; and a circuit for sensing whether current is being sourced/sunk to/from the current output node by the differential amplifier stage itself and in response thereto control the operation of the controllable current circuit to assist in sourcing/sinking the additional current so as to improve slew rate during swings in differential voltage input.

7. The differential amplifier of claim 6 wherein the differential amplifier is fabricated as an integrated circuit.

8. A The differential amplifier comprising:

a differential amplifier stage having differential voltage inputs, a current source transistor coupled to a current output node and a current sink transistor coupled to the current output node;

a compensation capacitor coupled to the current output node;

a current source sensor circuit coupled to the current source transistor and operable to detect when current is being sourced to the current output node by the current source transistor of the differential amplifier stage itself;

a current sink sensor circuit coupled to the current sink transistor and operable to detect when current is being sunk from the current output node by the current sink transistor of the differential amplifier stage itself;

an additional current source transistor also coupled to the current output node and operable responsive the current source sensor circuit to source additional current to the current output node; and an additional current sink transistor also coupled to the current output node and operable responsive the current sink sensor circuit to sink additional current to the current output node;

wherein the current source sensor circuit comprises:

a copy transistor with a common control terminal connection to the current source transistor of the differential amplifier stage; and a current supply coupled at a first node in series with the copy transistor, the first node coupled to control the additional current source transistor.

9. The differential amplifier of claim 8 wherein the differential amplifier is fabricated as an integrated circuit device.

10. A differential amplifier comprising:

a differential amplifier stage having differential voltage inputs, a current source transistor coupled to a current output node and a current sink transistor coupled to the current output node;

a compensation capacitor coupled to the current output node;

a current source sensor circuit coupled to the current source transistor and operable to detect when current is being sourced to the current output node by the current source transistor of the differential amplifier stage itself;

a current sink sensor circuit coupled to the current sink transistor and operable to detect when current is being sunk from the current output node by the current sink transistor of the differential amplifier stage itself;

an additional current source transistor also coupled to the current output node and operable responsive the current source sensor circuit to source additional current to the current output node; and an additional current sink transistor also coupled to the current output node and operable responsive the current sink sensor circuit to sink additional current to the current output node;

wherein the current sink sensor circuit comprises:

a copy transistor with a common control terminal connection to the current sink transistor of the differential amplifier stage; and a current supply coupled at a second node in series with the copy transistor, the second node coupled to control the additional current sink transistor.

11. The differential amplifier of claim 10 wherein the differential amplifier is fabricated as an integrated circuit device.

12. A differential amplifier comprising:

a differential amplifier stage having a differential voltage input and a current output node with respect to which the differential amplifier stage sources/sinks current;

a compensation capacitor coupled to the current output node; and a capacitor charge/discharge stage coupled to the differential amplifier stage and the compensation capacitor, the capacitor charge/discharge stage operating to detect when the differential amplifier stage is operating responsive to a high differential voltage input, comprising:

a charging circuit which responds to a first high differential voltage input swing to source a first current in addition to a differential amplifier stage sourced second current to the current output node; and a discharging circuit which responds to a second, opposite, high differential voltage input swing to sink a third current in addition to a differential amplifier stage sunk fourth current to the current output node;

wherein:

the charging circuit includes a first current sensor operable to detect differential amplifier stage supplied second current and source the first current in response thereto; and the discharging circuit includes a second current sensor operable to detect differential amplifier stage sunk fourth current and sink the third current in response thereto; and wherein:

the first current sensor functions to compare the second current to a first reference current and generate a first control signal in response to the comparison; and the second current sensor functions to compare the fourth current to a second reference current and generate a second control signal in response to the comparison.

13. The differential amplifier of claim 12 wherein:

the charging circuit farther includes an auxiliary current source having a control terminal coupled to receive the first control signal and generate the first current in response thereto; and the discharging circuit further includes an auxiliary current sink having a control terminal coupled to receive the second control signal and generate the second current in response thereto.

14. The differential amplifier of claim 13 wherein the auxiliary current source and auxiliary current sink each comprise a transistor.

15. The differential amplifier of claim 12 wherein the differential amplifier is fabricated as an integrated circuit device.

* * * * *

UNITED STATES PATENT AND TRADEMARK OFFICE
CERTIFICATE OF CORRECTION

| | | |
|---|---|---|
| PATENT NO. | : 7,548,117 B2 | Page 1 of 1 |
| APPLICATION NO. | : 11/654976 | |
| DATED | : June 16, 2009 | |
| INVENTOR(S) | : Gangqiang Zhang et al. | |

It is certified that error appears in the above-identified patent and that said Letters Patent is hereby corrected as shown below:

In the Claims:

At column 8, claim number 13, line number 52, please delete the word "farther" and replace with the word --further--.

Signed and Sealed this
Fourteenth Day of June, 2011

David J. Kappos
*Director of the United States Patent and Trademark Office*